United States Patent [19]

Jones

[11] 4,393,346

[45] Jul. 12, 1983

[54] VOLTAGE CONTROLLED RESISTOR

[75] Inventor: Ronald R. Jones, Phoenix, Ariz.

[73] Assignee: Circuit Research Labs, Tempe, Ariz.

[21] Appl. No.: 280,546

[22] Filed: Jul. 6, 1981

[51] Int. Cl.³ .............................................. G05F 1/46
[52] U.S. Cl. .................................... 323/280; 307/503; 330/261; 363/73
[58] Field of Search .................. 307/296 R, 297, 503; 323/273, 280, 282, 284; 330/85, 105, 261, 296; 363/13, 73

[56] References Cited

U.S. PATENT DOCUMENTS

| 3,536,988 | 10/1970 | Boynton | 323/280 |
| 3,793,480 | 2/1974 | Waehner | 307/503 X |
| 3,849,735 | 11/1974 | Haenen et al. | 330/261 |

Primary Examiner—A. D. Pellinen
Attorney, Agent, or Firm—Harry M. Weiss

[57] ABSTRACT

A voltage controlled resistor includes an operational transconductance amplifier (OTA) including first and second linearizing diodes which not only optimize signal-to-noise distortion levels but also represent the AC impedance from the inverting input to ground. The OTA turns on and off in response to the amount of gain control current being supplied thereto. A Darlington transistor is coupled to the output of the OTA for providing a low impedance buffered output. A first resistor provides current flow through the diodes. A feedback resistor supplies and controls bias current to one of the diodes. A third resistor maintains bias to the Darlington pair when the OTA output approaches open circuit output impedance conditions.

11 Claims, 2 Drawing Figures

4,393,346

VOLTAGE CONTROLLED RESISTOR

BACKGROUND OF THE INVENTION

1. Field of the Invention

This invention relates generally to a voltage controlled resistor (VCR) and, more particularly, to a self-calibrating VCR which avoids the necessity of calibration during manufacture or in the field.

2. Description of the Prior Art

Below the gain reduction threshold of a conventional VCR, an operational transconductance amplifier (OTA) exhibits an ultra-high output impedance which is capacitively coupled to the shunt junction of a resistor and an input buffer amplifier. As the input signal approaches a predetermined threshold, a full wave peak detector and integrator network cause the gain control current (Ic) to increase. This lowers the output impedance of the CTA which causes a signal voltage drop at the shunt junction. Because of the high gain of the peak detector and integrator network, the buffer amplifier output signal will remain within 2 db of its initial amplitude while the input signal may vary over a 25 db range.

Linearizing diodes are employed to improve the noise performance of the VCR. However, as the gain control current is varied, the bias current through the diodes can become significant if not balanced out by the internal differential currents. That is, the balancing of the linearizing diode currents is extremely critical since any difference error will manifest itself as a gain controlled offset voltage at the output of the amplifier during gain control current changes. Since the gain control current changes usually occur at a periodic rate of audible change, an audible noise voltage may be produced at the amplifier output.

SUMMARY OF THE INVENTION

It is an object of the present invention to provide an improved VCR.

It is a further object of the invention to provide a self-calibrating VCR which avoids the necessity for calibration during manufacture or field service. To this end, it is a feature of the invention that normal circuit tolerances and subsequent component aging effects are automatically compensated for.

It is a still further object of the invention to provide a VCR which employs multifunctional circuit components to reduce cost, complexity and reduce adverse environmental effects which are not compensated for by the design and manufacturing physics of the OTA.

According to a broad aspect of the invention there is provided a voltage controlled resistor comprising an operational transconductance amplifier having an inverting input, a non-inverting input adapted to be coupled to a first source of supply voltage, a diode bias input, a bias input for receiving a gain control current, first and second power terminals adapted to be coupled to second and third supply voltages, respectively, and an output for exhibiting a high output impedance when the gain control current is substantially zero, said output impedance decreasing as said gain control current increases, said operational transconductance amplifier having first and second linearizing diodes each having an anode coupled to said diode bias input, said first linearizing diode having a cathode coupled to said inverting input and said second linearizing diode having a cathode coupled to said non-inverting input; first means coupled to said output for providing a low impedance buffered output; first impedance means coupled to said diode bias input for producing current flow through said first and second linearizing diodes; second impedance means coupled to said low impedance buffered output for providing feedback to said inverting input and for supplying and controlling bias current to said first linearizing diode; and third impedance means coupled between said output and said diode bias input for maintaining bias to said first means when said output approaches open circuit output impedance conditions.

The above and other objects, features and advantages of the present invention will be better understood from the following detailed description taken in conjunction with the accompanying drawings, in which:

THE SPECIFICATION

Figure 1:
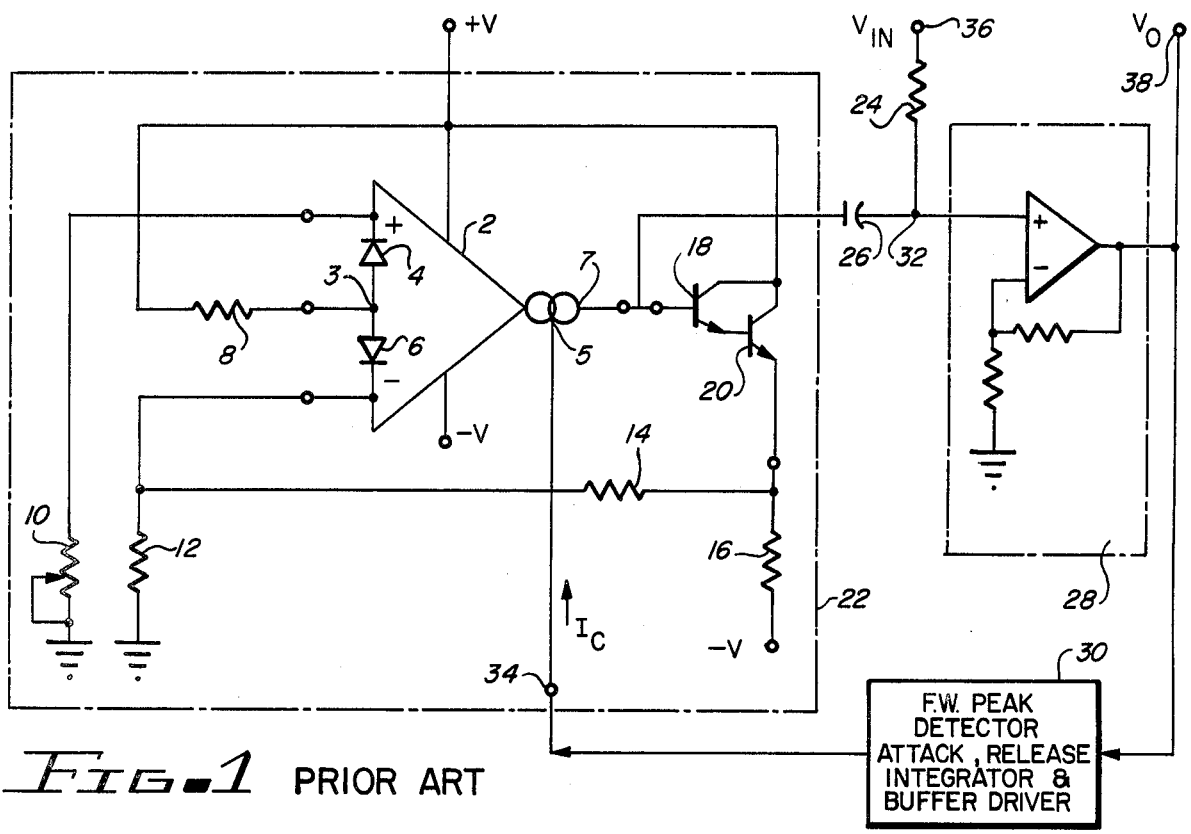
FIG. 1 is a schematic diagram of a VCR circuit according to the prior art.

The circuit of FIG. 1 is a schematic diagram of a VCR according to the prior art. It includes OTA circuitry 22 having an output which is capacitively coupled via capacitor 26 to shunt junction 32 of resistor 24 and buffer amplifier 28. An input voltage (Vin) is applied to terminal 36, and the output voltage (Vo) appears at terminal 38. The output voltage (Vo) is fed back to full wave peak detector, attack/release integrator and buffer driver 30 which in turn has an output coupled to the bias input 5 of OTA 2.

OTA 2 (e.g. an LM13600 manufactured by National Semiconductor) is equipped with linearizing diodes 4 and 6, inverting input (−), non-inverting input (+), diode bias input 3, voltage supply inputs (+V and −V), and output 7. A potentiometer 10 is coupled between the ground and the non-inverting input (+), and a resistor 8 is coupled between diode bias input 3 and +V. OTA output 7 is coupled to the input of a Darlington pair of transistors 18 and 20 the collectors of which are coupled to +V. The emitter of transistor 20 is coupled to −V via resistor 16 and to the inverting input (−) of OTA 2 via resistor 14. A resistor 12 is coupled between ground and the junction of resistor 14 and the inverting input (−) of OTA 2.

The prior art circuit shown in FIG. 1 operates in the following manner. Below the gain reduction threshold, OTA circuitry 22 exhibits an ultra-high output impedance which is capacitively coupled via capacitor 26 to junction 32. As the input signal approaches a specific threshold, full wave peak detector and integrator 30 causes gain control current Ic at node 34 to increase. This lowers the output impedance of the OTA and via capacitor 26 causes a signal voltage drop at junction 32. Due to the high gain of peak detector and integrator 30, the output signal of amplifier 28 will remain within 2 db while the input signal may vary over a range of 25 db.

Resistor 8 produces current flow through linearizing diodes 4 and 6 to optimize signal-to-noise versus distortion levels in the remaining OTA circuitry. Resistors 12 and 14 provide a conventional output to inverting input (−) to reduce the output signal to an optimum input level. Potentiometer 10 is required to balance the bias current flow between diodes 4 and 6. This in turn maintains the balance of the internal amplifier differential quiescent currents. As the gain control current is varied, the bias current through the diodes can become significant. If the diode current balancing is not correct, an audible noise voltage is produced at the output as described above.

Darlington transistor pair 18 and 20 translate the widely varying output impedance of the OTA amplifier into a low output impedance necessary to drive feedback resistor network 12 and 14. Resistor 16 is the emitter resistor which provides a current supply and stable output impedance for the Darlington transistor pair. Because gain control terminal 34 is referenced to $-V$, the buffer circuit control signal in circuit 30 is produced by an integrated DC gain control voltage going positive from $-V$ and driving current through a current limiting resistor into control terminal 34.

Figure 2:
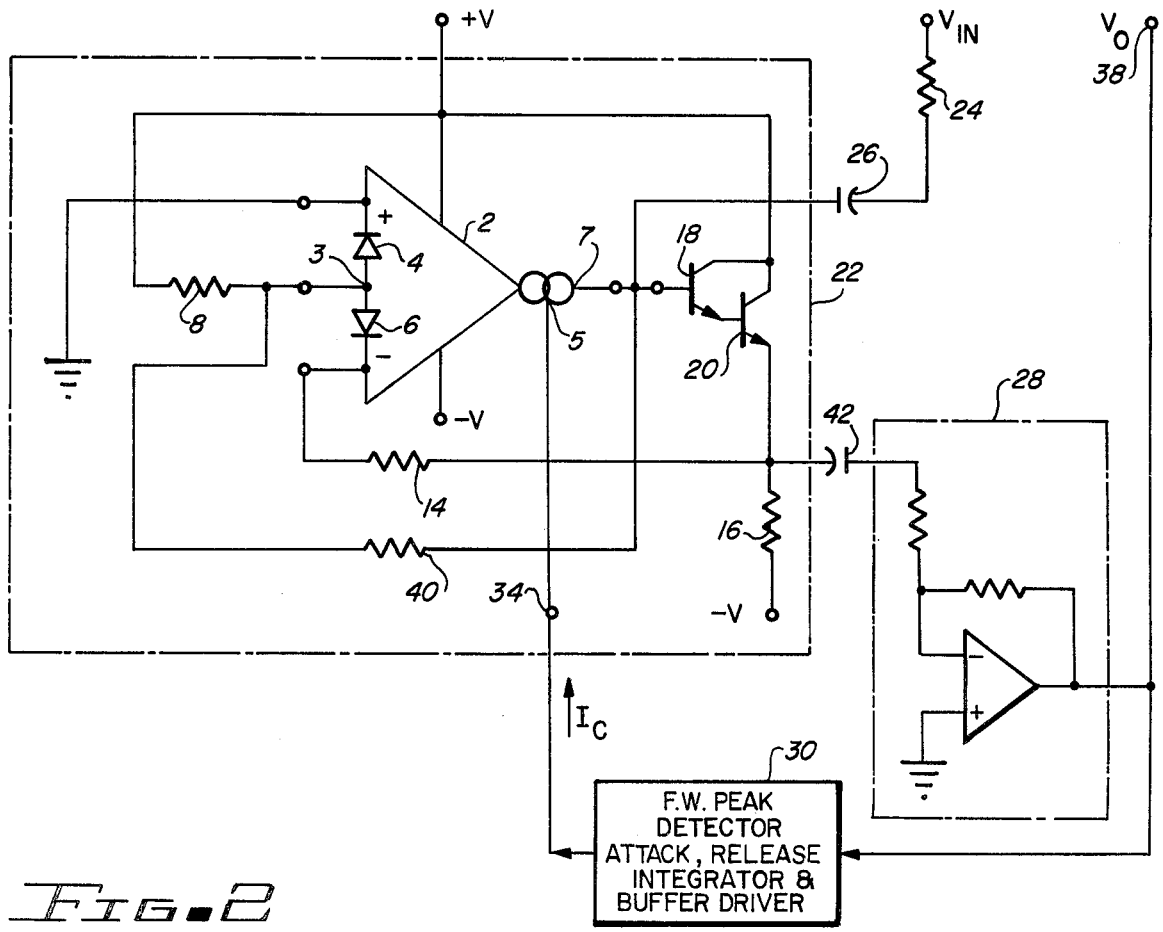
FIG. 2 is a schematic diagram of a VCR circuit according to the present invention.

FIG. 2 is a schematic diagram of a self calibrating VCR according to the present invention where like circuit components are identified by like reference numerals. As can be seen, potentiometer 10 and resistor 12 have been eliminated and a new resistor 40 is coupled between diode bias input 3 and the output 7 of OTA 2. Junction 32 has also been eliminated and the emitter of transistor 20 is capacitively coupled via new capacitor 42 to buffer amplifier 28.

The circuit shown in FIG. 2 operates in the following manner: Below the gain reduction threshold, OTA circuitry 22 exhibits an open circuit output impedance at output 7 since the gain control current Ic at node 34 is substantially zero. The impedance which is capacitively coupled to resistor 24 by capacitor 26 is then substantially equal to the resistance of resistor 40. Resistor 40 is sufficiently large with respect to resistor 24 to cause little, if any, input signal voltage drop across resistor 24. Darlington transistors 18 and 20 provide a low impedance buffered output of the input signal voltage, and is capacitively coupled by capacitor 42 to gain stage 28. As the input signal approaches a specific threshold, the full wave peak detector and integrator 30 causes the gain control current Ic to increase turning on OTA 2 and lowering its output impedance which is in parallel with resistor 40 and, via capacitor 26, is in shunt with resistor 24. This causes an input signal voltage drop across resistor 24 causing a signal drop to be reflected to the input and output of the gain stage 28. As was the case previously, the output of the gain stage 28 will remain steady to within 2 db while the input may vary over a 25 db range.

The circuit shown in FIG. 2 contains multifunction components. Resistor 8 which is now much larger than resistor 14 produces current flow through the input linearizing diodes 4 and 6 in order to optimize signal-to-noise versus distortion levels in the remainder of the OTA circuitry. The diodes accomplish this by permitting higher input signals for a given distortion level in the output. Diode 4 is coupled to ground via the non-inverting input (+) of OTA 2. Resistor 14 provides AC feedback from the output at the emitter of transistor 20 to the inverting input (−) of OTA 2 and is of a sufficiently low value to supply and control bias current to diode 6. Since there is no resistor between the inverting input (−) and ground, the inverting input and diode 6 receive 100 percent DC negative feedback. This permits the OTA to control and automatically balance the input linearizing diode currents through diodes 4 and 6.

From an AC point of view, the absence of a resistor between the inverting input of OTA 2 and ground may cause the amplifier to appear to have unity gain. In fact, at low signal levels the AC impedance to ground at the inverting input (−) is approximately 80 to 90 ohms and is the series impedance of diodes 4 and 6 which is in turn controlled by the DC current flowing through them. Thus, the necessary attenuation of the output signal is fed back through resistor 14 to the inverting input.

In summary, when OTA 2 is on (as controlled by the gain control current), feedback resistor 14 maintains DC output offset control by controlling the current flow in input linearizing diode 6. In turn, the linearizing diodes 4 and 6 are utilized as the AC impedance from the inverting input to ground.

When the gain control current to input 5 of OTA 2 is turned off, the output impedance of the amplifier is that of an open circuit. Should this occur, there is no bias to transistors 18 and 20. This in turn would permit the emitter of transistor 20 to go negative which would then in turn unbalance the current flow in linearizing diodes 4 and 6. This would cause DC offset fluctuations and audible noise in the output during gain control operation as described in connection with the prior art with one difference. It would occur only at the gain reduction threshold and at transitions above and below that point. To prevent this, resistor 40 is used to maintain bias to buffer transistors 18 and 20 when the OTA output approaches open circuit output impedance conditions. The proper voltage bias for a resistor 40 of high resistance is conveniently 0.7 volts above ground or connection at the input linearizing diode bias input 3.

Since the output impedance of buffer transistors 18 and 20 is low, the emitter of transistor 20 is chosen to be capacitively coupled to gain stage 28 avoiding the necessity of a gain stage having an ultra-high input impedance.

The above description is given by way of example only. Changes in form and details may be made by one skilled in the art without departing from the scope of the invention as defined by the appended claims.

What is claimed is:

1. A voltage controlled resistor circuit, comprising:
   an operational transconductance amplifier having an inverting input, a non-inverting input adpated to be coupled to a first source of supply voltage, a diode bias input, a bias input for receiving a gain control current, first and second power supply terminals adapted to be coupled to second and third supply voltages, respectively, and an output for exibiting a high output impedance when the gain control current is substantially zero, said output impedance decreasing as said gain control current increases, said operational transconductance amplifier having first and second linearizing diodes each having an anode coupled to said diode bias input, said first linearizing diode having a cathode coupled to said inverting input and said second linearizing diode having a cathode coupled to said non-inverting input;
   first means coupled to said output for providing a low impedance buffered output;
   first impedance means coupled to said diode bias input for producing current flow through said first and second linearizing diodes;
   second impedance means coupled to said low impedance buffered output for providing feedback to said inverting input and for supplying and controlling bias current to said first linearizing diode; and
   third impedance means coupled between said output and said diode bias input for maintaining bias to said first means when said output approaches open circuit output impedance conditions.

2. A voltage controlled resistor circuit according to claim 1 wherein said first means comprises:
   a first transistor having a base coupled to said output, a collector adapted to be coupled to said second supply voltage and having an emitter; and
   a second transistor having a base coupled to the emitter of said first transistor, a collector adapted to be coupled to said second supply voltage and an emitter adapted to be coupled to said third supply voltage, said low impedance buffered output appearing at the emitter of said second transistor.

3. A voltage controlled resistor circuit according to claim 2 wherein said first impedance means is a first resistor.

4. A voltage controlled resistor circuit according to claim 3 wherein said second impedance means is a second resistor.

5. A voltage controlled resistor according to claim 4 wherein said third impedance means is a third resistor.

6. A voltage controlled resistor according to claim 5 wherein said first resistor is substantially larger than said second resistor.

7. A voltage controlled resistor according to claim 6 further including a gain stage having an input coupled to the output of said operational transconductance amplifier and having an output.

8. A voltage controlled resistor according to claim 7 further including means coupled to the output of said gain stage for controlling said gain current.

9. A voltage controlled resistor according to claim 8 further including a fourth resistor coupled between the emitter of said second transistor and said third supply voltage.

10. A voltage controlled resistor circuit, comprising:
    an operational transconductance amplifier having an inverting input, a non-inverting input adapted to be coupled to a first source of supply voltage, bias input for receiving a gain control current, first and second power supply terminals adapted to be coupled to second and third supply voltages, respectively, and an output for exibiting a high output impedance when the gain control current is substantially zero, said output impedance drecreasing as said gain control current increases, comprising:
    first means coupled to said output for providing a low impedance buffered output;
    second impedance means coupled to said low impedance buffered output for providing feedback to said inverting input; and
    third impedance means coupled to said output for maintaining bias to said first means when said output approaches open circuit output impedance conditions.

11. A voltage controlled resistor circuit according to claim 10 further comprising:
    at least first and second diodes for linearizing the input of said operational transconductance amplifier, said first diode having a cathode coupled to said inverting input and said second diode having a cathode coupled to said non-inverting input, the anodes of said first and second diodes adapted to be coupled to a bias voltage source; and
    current limiting means coupled between said anodes and said bias voltage source.

* * * * *